(12) United States Patent
Abdo

(10) Patent No.: US 10,133,985 B2
(45) Date of Patent: *Nov. 20, 2018

(54) INTEGRATED DRIVE AND READOUT CIRCUIT FOR SUPERCONDUCTING QUBITS

(71) Applicant: INTERNATIONAL BUSINESS MACHINES CORPORATION, Armonk, NY (US)

(72) Inventor: Baleegh Abdo, Fishkill, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/817,465

(22) Filed: Nov. 20, 2017

(65) Prior Publication Data

US 2018/0285760 A1 Oct. 4, 2018

Related U.S. Application Data

(63) Continuation of application No. 15/478,906, filed on Apr. 4, 2017, now Pat. No. 9,870,536.

(51) Int. Cl.
| | |
|---|---|
| *H03K 19/195* | (2006.01) |
| *G06N 99/00* | (2010.01) |
| *H01L 39/22* | (2006.01) |
| *B82Y 10/00* | (2011.01) |

(52) U.S. Cl.
CPC ......... *G06N 99/002* (2013.01); *H01L 39/223* (2013.01); *B82Y 10/00* (2013.01)

(58) Field of Classification Search
CPC ............... G09G 99/002; H03K 19/195; H03K 19/1954; H03K 17/92; B82Y 10/00; H01L 39/22; H01L 39/221; H01L 39/223; H01L 39/228; G06N 99/002
USPC ........................................................ 326/1–7
See application file for complete search history.

(56) References Cited

U.S. PATENT DOCUMENTS

| | | | |
|---|---|---|---|
| 6,486,694 B1 * | 11/2002 | Kirichenko | ........ H03K 19/1954 326/3 |
| 8,817,254 B2 | 8/2014 | Santori et al. | |
| 9,438,246 B1 * | 9/2016 | Naaman | ............... H03K 19/195 |
| 9,455,707 B2 * | 9/2016 | Herr | .......................... H03K 3/38 |
| 9,735,776 B1 * | 8/2017 | Abdo | ..................... H03K 17/92 |
| 9,818,064 B1 * | 11/2017 | Abdo | ................... G06N 99/002 |
| 9,870,536 B1 * | 1/2018 | Abdo | ................... G06N 99/002 |

(Continued)

FOREIGN PATENT DOCUMENTS

WO 2015057839 A1 4/2015

OTHER PUBLICATIONS

Baleegh Abdo, "Integrated Drive and Readout Circuit for Superconducting Qubits", Related Application, U.S. Appl. No. 15/478,906, filed Apr. 4, 2017.

(Continued)

*Primary Examiner* — Jason M Crawford
(74) *Attorney, Agent, or Firm* — Cantor Colburn LLP; Vazken Alexanian

(57) ABSTRACT

Embodiments of the present invention are directed to an integrated drive and readout circuit assembly. Directional couplers are configured to connect to qubit-resonator systems. Diplexers are coupled to the directional couplers. A microwave signal combiner is coupled to the diplexers.

20 Claims, 8 Drawing Sheets

(56) References Cited

U.S. PATENT DOCUMENTS

| | | | |
|---|---|---|---|
| 2003/0021518 A1 | 1/2003 | Smirnov et al. | |
| 2011/0065586 A1* | 3/2011 | Maibaum | B82Y 10/00 505/170 |
| 2016/0156356 A1* | 6/2016 | Bronn | H03K 19/195 326/5 |
| 2016/0156357 A1* | 6/2016 | Miller | G06N 99/002 326/3 |
| 2016/0267032 A1* | 9/2016 | Rigetti | G06N 99/002 |
| 2016/0308502 A1* | 10/2016 | Abdo | H03F 7/04 |
| 2017/0170813 A1* | 6/2017 | Abdo | H01L 39/025 |
| 2018/0054201 A1* | 2/2018 | Reagor | G06N 99/002 |

OTHER PUBLICATIONS

List of IBM Patents or Patent Applications Treated as Related; (Appendix P), Filed Nov. 20, 2017.
PCT/IB2017/057651 International Search Report and Written Opinion, dated Mar. 27, 2018.

\* cited by examiner

FIG. 1 READOUT

FIG. 2 QUBIT DRIVE

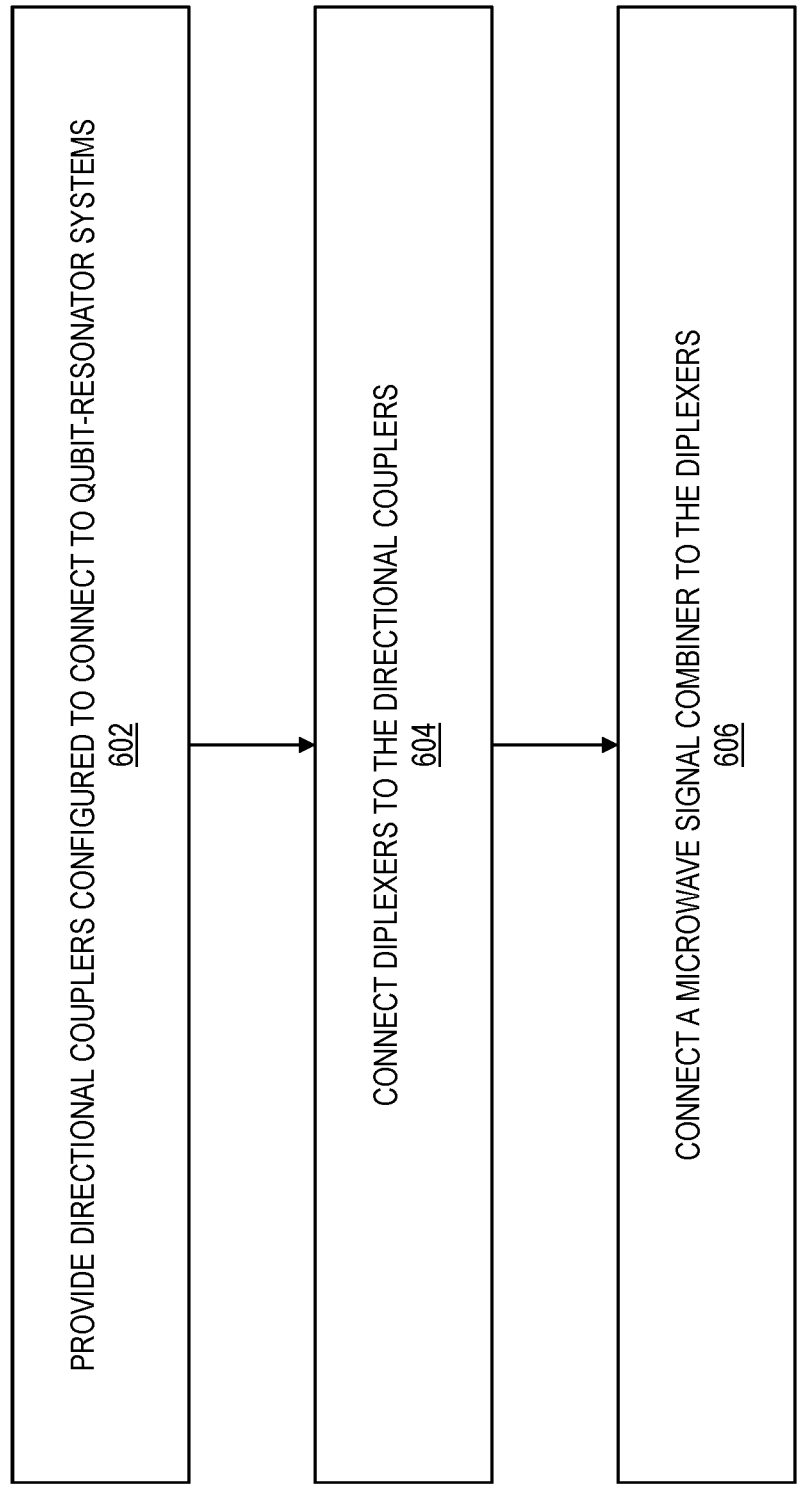

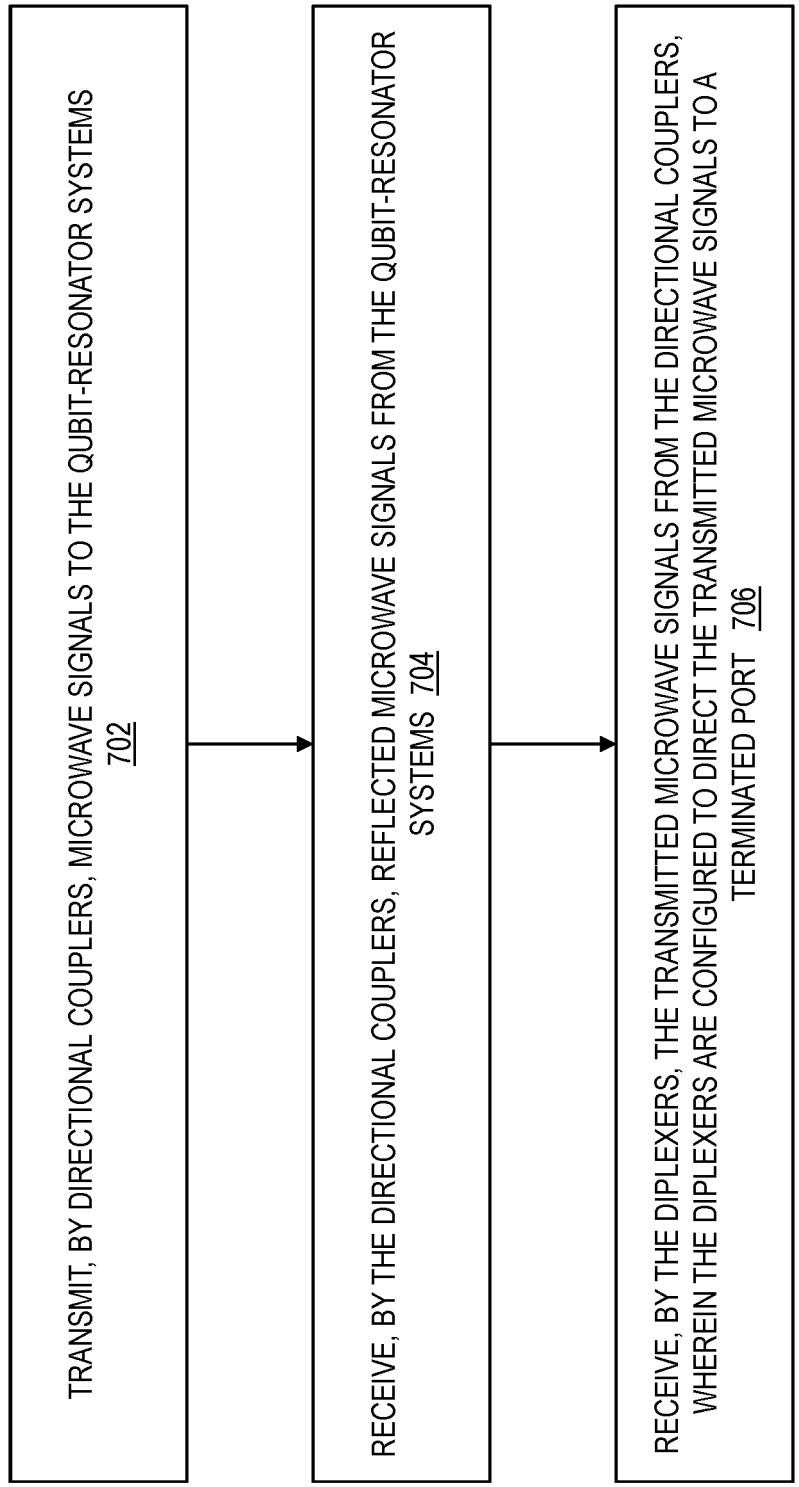

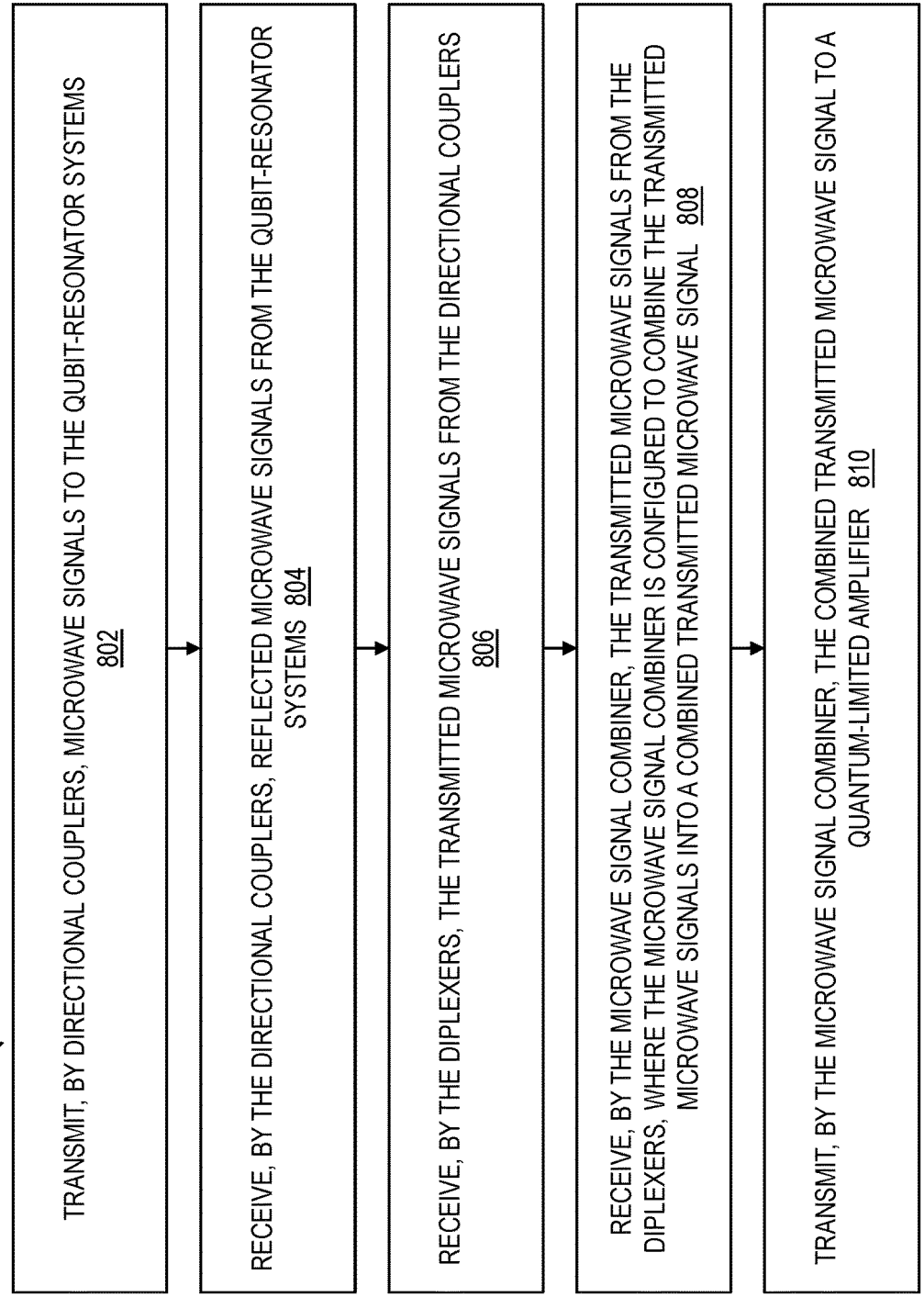

INTEGRATED DRIVE AND READOUT CIRCUIT FOR SUPERCONDUCTING QUBITS

DOMESTIC PRIORITY

This application claims priority to U.S. application Ser. No. 15/478,906, entitled "INTEGRATED DRIVE AND READOUT CIRCUIT FOR SUPERCONDUCTING QUBITS", filed Apr. 4, 2017, which is incorporated herein by reference in its entirety.

BACKGROUND

The present invention relates generally to superconducting electronic devices, and more specifically, to integrated drive and readout circuits for superconducting qubits.

The fundamental element of a quantum computer is the quantum bit which is known as the "qubit." As opposed to a classical bit representing zero and one, a qubit is also able to represent a quantum superposition of the two states. The states can be formalized within the laws of quantum physics as a probability of being in the two states. Accordingly, the states can be manipulated and observed within the laws of quantum physics.

In cavity quantum electrodynamics, quantum computing employs nonlinear superconducting devices (i.e., qubits) to manipulate and store quantum information at microwave frequencies, and resonators (e.g., as a two-dimensional (2D) planar waveguide or as a three-dimensional (3D) microwave cavity) to read out and facilitate interaction among qubits. As one example, each superconducting qubit can include one or more Josephson junctions shunted by capacitors in parallel with the junctions. The qubits are capacitively coupled to resonators such as, for example, 2D or 3D microwave cavities).

The electromagnetic energy associated with the qubit is stored in the Josephson junctions and in the capacitive and inductive elements forming the qubit. In one example, to read out the qubit state, a microwave signal is applied to the microwave readout cavity that couples to the qubit at the cavity frequency corresponding to the qubit state. The transmitted (or reflected) microwave signal goes through multiple thermal isolation stages and low-noise amplifiers that are required to block or reduce the noise and improve the signal-to-noise ratio. The microwave signal is measured at room temperature. The amplitude or phase of the readout microwave signal (or both) can, depending on the readout scheme, carry information about the qubit state. This readout signal can be measured and analyzed using room-temperature electronics. Microwave readout provides a stable signal amplitude for control, and commercial off-the-shelf (COTS) hardware is available to use.

Quantum systems such as superconducting qubits are very sensitive to electromagnetic noise, particularly in the microwave and infrared domains. In order to protect these quantum systems from microwave and infrared noise, several layers of filtering, attenuation, and isolation are applied. Particular interest is directed to the layers of protection employed on the input and output (I/O) lines, which are also called transmission lines. The I/O lines (transmission lines) are connected to the quantum system and carry the input and output signals to and from the quantum system respectively. In the case of superconducting qubits, these I/O lines (transmission lines) are usually microwave coaxial lines or waveguides. Some of the techniques or components that are used in order to block or attenuate the noise propagating or leaking into these transmission lines are attenuators, circulators, isolators, low-pass microwave filters, bandpass microwave filters, and infrared filters which are based on lossy absorptive materials or dispersive elements. An integrated drive and readout circuit is needed to drive and readout the superconducting qubits with a minimum number of input and output transmission lines and minimum number of components.

SUMMARY

Embodiments of the present invention are directed to an integrated drive and readout circuit assembly. A non-limiting example of the integrated drive and readout circuit assembly includes directional couplers configured to connect to qubit-resonator systems, diplexers coupled to the directional couplers, and a microwave signal combiner coupled to the diplexers.

Embodiments of the present invention are directed to a method of forming an integrated drive and readout circuit assembly. A non-limiting example of the method includes providing directional couplers configured to connect to qubit-resonator systems, coupling diplexers to the directional couplers, and coupling a microwave signal combiner to the diplexers.

Embodiments of the present invention are directed to a chip. A non-limiting example of the chip includes directional couplers configured to connect to qubit-resonator systems, diplexers coupled to the directional couplers, and a microwave signal combiner coupled to the diplexers.

Embodiments of the present invention are directed to a method of driving qubit-resonator systems. A non-limiting example of the method includes transmitting, by directional couplers, microwave signals to the qubit-resonator systems, receiving back, by the directional couplers, the microwave signals having been reflected from the qubit-resonator systems, and receiving, by diplexers, the microwave signals from the directional couplers. The diplexers are configured to direct the microwave signals to a termination.

Embodiments of the present invention are directed to a method of reading out qubit-resonator systems. A non-limiting example of the method includes transmitting, by directional couplers, microwave signals to the qubit-resonator systems, receiving back, by the directional couplers, the microwave signals having been reflected from the qubit-resonator systems, and receiving, by diplexers, the microwave signals from the directional couplers, receiving, by a microwave signal combiner, the microwave signals from the diplexers. The microwave signal combiner is configured to combine the microwave signals into combined microwave signals. Also, the method includes transmitting, by the microwave signal combiner, the combined microwave signals to a quantum-limited amplifier.

BRIEF DESCRIPTION OF THE DRAWINGS

FIG. 6 is a flow chart of a method of forming an integrated drive and readout circuit according to embodiments of the present invention.

FIG. 7 is flow chart of a method of driving qubit-resonator systems according to embodiments of the present invention.

FIG. 8 is a flow chart of a method of reading out qubit-resonator systems according to embodiments of the present invention.

DETAILED DESCRIPTION

Figure 1:
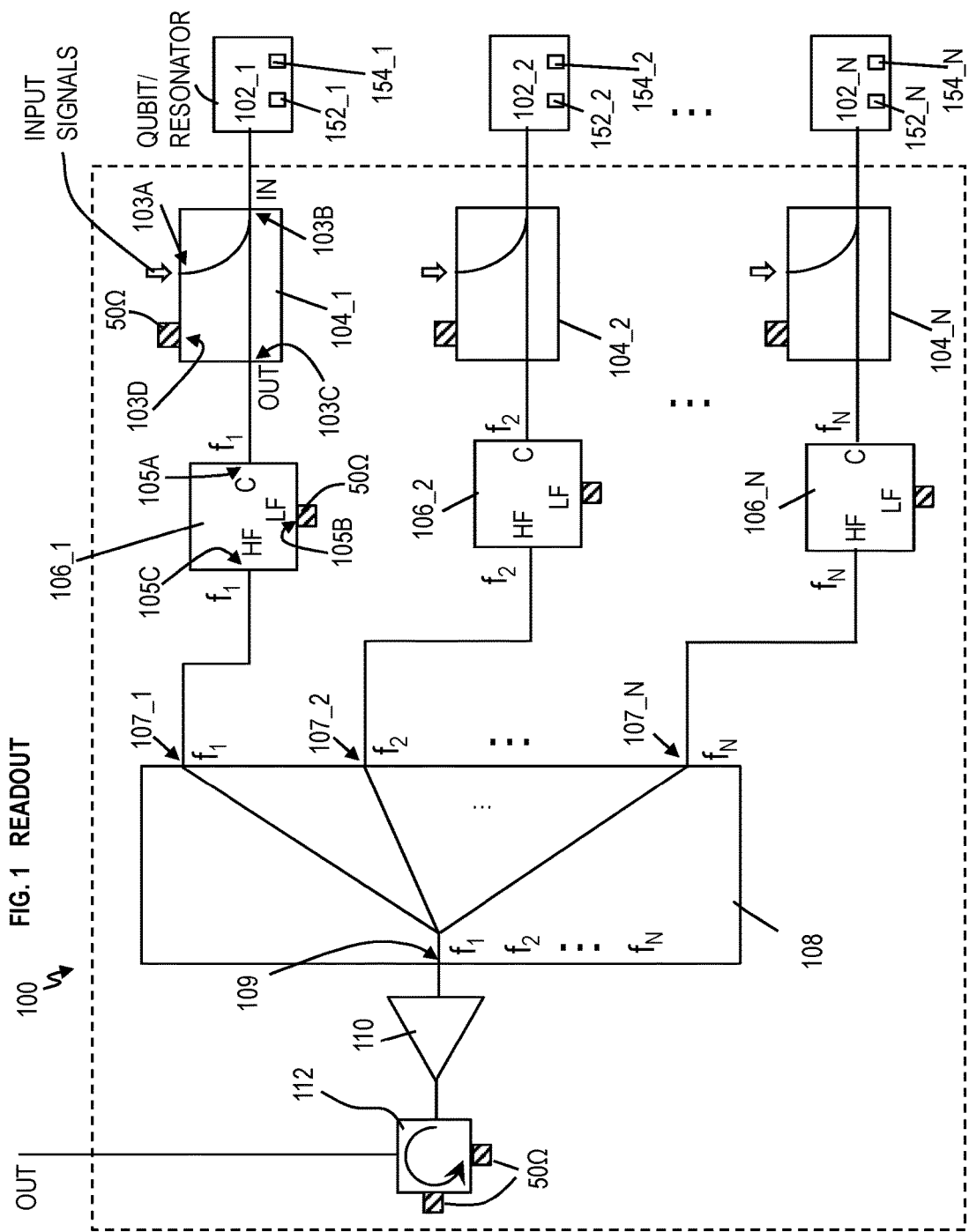
FIG. 1 is a schematic of an integrated drive and readout circuit illustrating readout of superconducting qubits according to embodiments of the present invention.

Various embodiments of the present invention are described herein with reference to the related drawings. Alternative embodiments of the present invention can be devised without departing from the scope of this document. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

Several physical objects have been suggested as potential implementations of qubits. However, solid-state circuits, and superconducting circuits in particular, are of great interest as they offer scalability which is the possibility of making circuits with a larger number of interacting qubits. Superconducting qubits are typically based on Josephson junctions (JJ). A Josephson junction is two superconductors coupled by, for example, a thin insulating barrier. A Josephson junction can be fabricated by means of an insulating tunnel barrier, such as $Al_2O_3$, between superconducting electrodes. For such Josephson junctions, the maximum allowed supercurrent is the critical current $I_c$.

Embodiments are configured to build a scalable qubit drive and readout circuit that minimizes the number of output lines and control lines of the circuit. Embodiments provide techniques to build a scalable qubit drive and readout circuit which can be integrated together on the same circuit board or chip.

Additionally, embodiments are configured to minimize the number of circulators and isolators. Embodiments further provided a scalable qubit drive and readout circuit that can be optimized, replaced, and thermalized well. To emphasize the size/space of circulators and isolators, the size of a commercial cryogenic isolator is about 8.5 centimeters (cm)×3.1 cm×1.7 cm, and it weighs about 229.5 grams (g). A copper bracket is used to thermalize the cryogenic isolator weighs about 183.1 g. The size of a commercial cryogenic circulator is about 4.5 cm×3.5 cm×1.8 cm, and it weighs about 41.2 g. In a standard 1 input 1 output line setup, which connects 1 qubit-resonator and 1 quantum-limited amplifier (JPC), the state-of-the-art uses two circulators and three isolators. This accounts for a volume of at least 191.1 $cm^3$ and weight of at least 1.5 kg (and this weight is just from the circulators and isolators). The volume calculation does not take into account the weight of the copper brackets that are used for thermalization. In contrast, embodiments provide a structure with 1 output line and 1 (optional) circulator/isolator.

Figure 2:
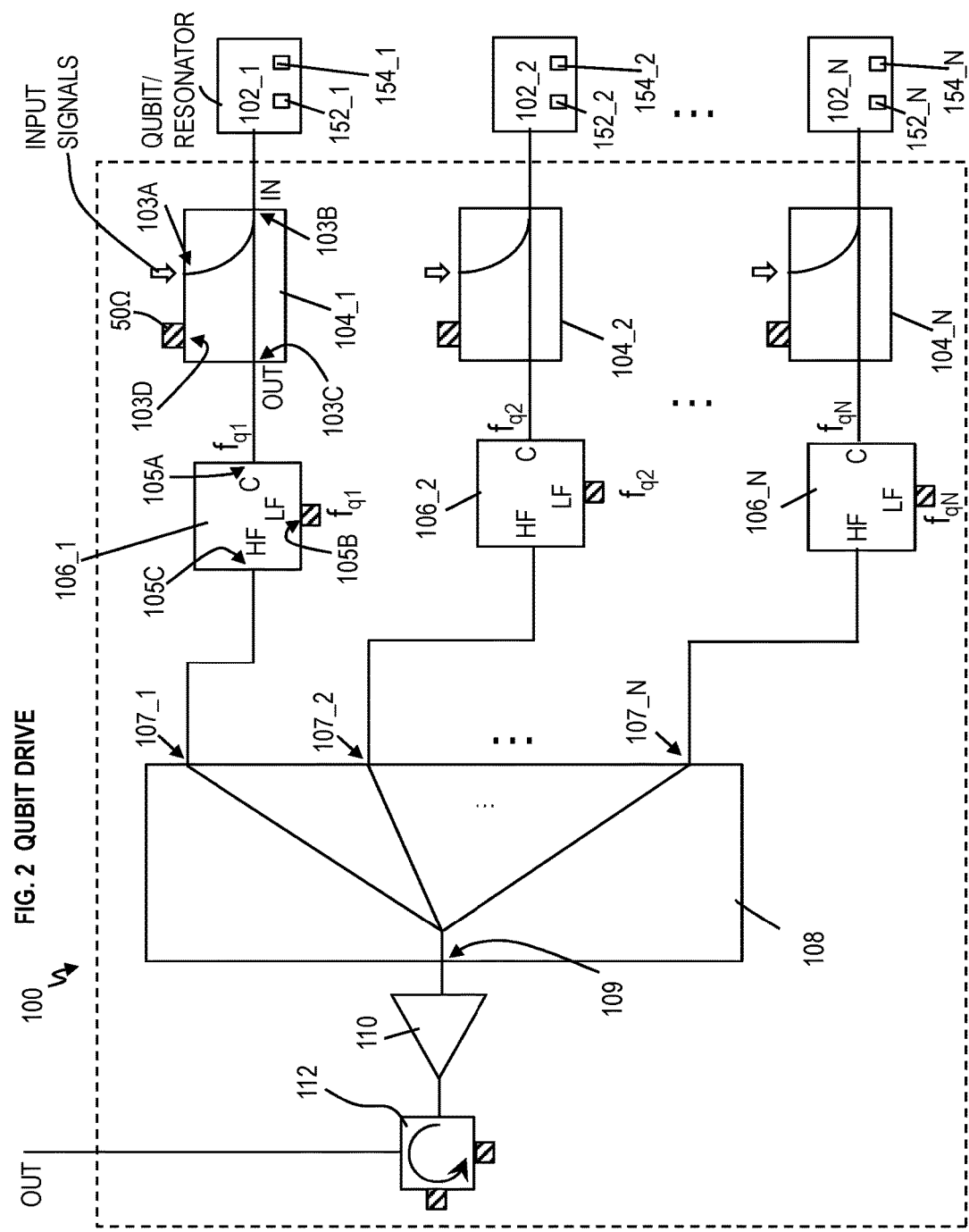
FIG. 2 is a schematic of the integrated drive and readout circuit illustrating driving the superconducting qubits according to embodiments of the present invention.

Now turning to the figures, FIG. 1 is a schematic of an integrated drive and readout circuit assembly 100 illustrating readout of superconducting qubits according to embodiments. FIG. 2 is a schematic of the integrated drive and readout circuit 100 illustrating driving the superconducting qubits according to embodiments. The system in FIGS. 1 and 2 are identical and illustrate a difference in operation (i.e., reading the qubits versus driving the qubits respectively) of the circuits 100. FIGS. 1 and 2 (along with FIG. 3) apply to qubit-resonator systems operating in reflection as understood by one skilled in the art.

The circuit 100 can be implemented on chip and/or on a printed circuit board and/or as an integrated circuit. For example, the integrated drive and readout circuit 100 can be a chip. The circuit 100 is operatively connected to quantum systems. A quantum system is a superconducting qubit coupled to a readout resonator such that the superconducting qubit can be driven (i.e., driven to an excited state or a superposition of ground and excited states) and read out. The read out of the state of the qubit is by measuring the readout resonator. There are qubit-resonator systems 102_1 through 102_N, where N corresponds to the last number of qubit-resonator systems. Each qubit-resonator systems 102_1 through 102_N has its own superconducting qubit coupled to a readout resonator. For example, the qubit-resonator systems 102_1 through 102_N respectively have superconducting qubits 154_1 through 154_N and respectively have readout resonator 152_1 through 152_N. As noted above, readout resonators can be implemented as lumped-element resonators, microstrip/stripline resonators, coplanar waveguide resonators, 3D microwave cavities, etc.

Figure 3:
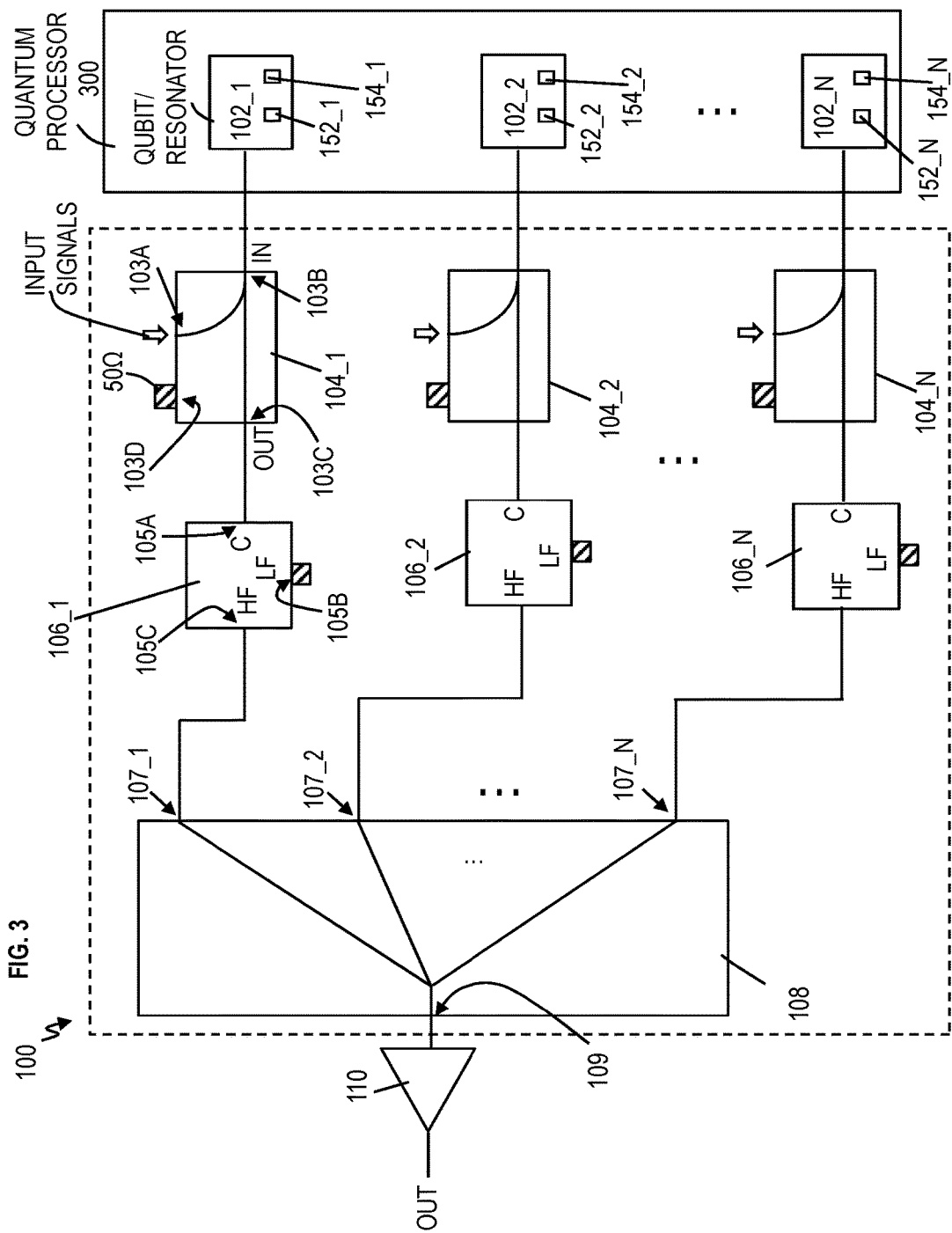
FIG. 3 is a schematic of an integrated drive and readout circuit according to embodiments of the present invention.

The integrated drive and readout circuit 100 includes wideband directional couplers 104_1 through 104_N operatively connected to the qubit-resonator systems 102_1 through 102_N, respectively. The circuit 100 includes diplexers 106_1 through 106_N operatively connected to the wideband directional couplers 104_1 through 104_N, respectively. A signal combiner 108 is operatively connected to each of the diplexers 106_1 through 106_N such that the signal combiner 108 receives input from the diplexers 106_1 through 106_N. Optionally, the circuit 100 can include a wideband quantum-limited directional amplifier 110 having its input operatively connected to the output of the signal combiner 108. Optionally, the circuit 100 can include a wideband on-chip 4-port circulator 112 or a wideband isolator, which is connected to the output of the wideband quantum-limited directional amplifier 110. The wideband quantum-limited directional amplifier 110 and the wideband on-chip 4-port circulator 112 can optionally be on-chip which means on the chip/circuit 100 or off-chip. FIG. 3 is an example of the wideband quantum-limited directional amplifier 110 and the wideband on-chip 4-port circulator 112 being off-chip.

According to embodiments, the scalable qubit drive and readout circuit 100 is used to drive and measure an array of circuit quantum electrodynamics systems (such as superconducting cavity/readout resonator-qubit systems 102_1 through 102_N) which are driven and measured in reflection. The superconducting cavity/readout resonator-qubit systems 102_1 through 102_N are depicted for explanation purposes. It should be appreciated that this drive and readout circuit/scheme is not limited to superconducting qubits. It can be used with any type of qubits coupled to microwave resonators (i.e., any quantum system). One condition is that the qubit drive signals and readout signal are fed to the same port of the quantum system.

Now turning to the components of the circuit assembly 100 in more detail, the wideband directional couplers 104_1 through 104_N have a frequency band that covers (i.e., encompasses) the frequency range of both qubits (i.e., qubits 154 and readout resonators 152). The wideband directional couplers 104_1 through 104_N are 4-port devices with ports 103A, 103B, 103C, and 103D. Couplers are configured to couple a defined amount of electromagnetic power of a signal from a certain port to another port thereby enabling the signal to be used in another circuit. Only the directional coupler 104_1 is labeled with ports 103A-103D so as not to obscure the figures. However, it should be appreciated that the other directional couplers 104_2 through 104_N analogously have the same ports and operate the same as the directional coupler 104_1 having its ports labeled for ease of understanding.

The drive signals and readout signals are fed through the coupled port 103A of the directional couplers 104_1 through 104_N. The isolated port 103D of the directional coupler 104_2 through 104_N is terminated by a 50 ohm (Ω) termination. The 50 ohm Ω termination can be either on-chip or an external 50Ω termination. The 50Ω termination can be a load, such as a resistive load. The input port 103B of the directional coupler 104_1 through 104_N is connected to the qubit-readout resonator systems 102_1 through 102_N. The attenuation of the signals (drive signals and/or readout signals) coupling from the coupled port 103A to the input port 103B is between 10-30 decibels (dB).

The output port 103C of the directional coupler 104_1 through 104_N is connected to on-chip diplexers 106_1 through 106_2. The purpose of the diplexers 106_1 through 106_2 is to direct the reflected qubit pulses (i.e., reflected drive signals) to the 50Ω termination (on chip or external) so that the reflected qubit pulses are dissipated, while passing the reflected readout signals toward the output line/chain (OUT). The different readout signals which pass through the different diplexers 106_1 through 106_N are combined using the signal combiner 108 for quantum signals (i.e., the reflected readout signals), and the signal combiner 108 uses frequency division multiplexing to combine the different (reflected) readout signals onto a single transmission line carrying readout signal at frequencies $f_1, f_2, \ldots f_N$. The readout signals can be applied in series, in parallel, or in any combination. The different combined readout signals at frequencies $f_1, f_2, \ldots f_N$ are output from the signal combiner 108 to the wideband directional amplifier 110. The wideband directional amplifier 110 amplifies the combined readout signals at frequencies $f_1, f_2, \ldots f_N$. The wideband directional amplifier 110 can be followed by an on-chip circulator 112 or isolator which protects the quantum systems (such as the qubit-cavity/readout resonator systems 102_1 through 102_N) from noise coming down from the output chain (i.e., OUT). The on-chip circulator 112 or isolator can be realized by using three-wave mixing devices (for example, Josephson parametric converters) and hybrids or by using ferrites and permanent magnets.

As an example of driving a qubit-resonator in FIG. 2, the following scenario explains driving the qubit-resonator system 102_1 having the readout resonator 152_1 and superconducting qubit 154_1 but applies by analogy to driving the qubit-resonator system 102_2 through 102_N having readout resonators 152_2 through 152_N and superconducting qubits 154_2 through 154_N, respectively. The qubit-resonator system 102_1, directional coupler 104_1, and diplexer 106_1 are all in a one-to-one relationship.

Each of the qubit-resonator system 102_1 through 102_N can be driven simultaneously, nearly simultaneously, and/or in series. Each of the qubits 154_1 through 154_N has its resonance frequency which can be referred as a qubit frequency or qubit resonance frequency. For example, the qubits 154_1 through 154_N have qubit resonance frequencies $f_{q1}$ through $f_{qN}$ respectively, where N is the last number. These frequencies can be the same or different (i.e., close to each other, for example a few megahertz, or far from each other, for example a few hundreds of megahertz), depending on the particular implementation scheme of the quantum processor. In the example scenario of driving the qubit-resonator system 102_1, the qubit 154_1 has the qubit resonance frequency $f_{q1}$. Accordingly, a (drive) microwave signal (tone) at the frequency $f_{q1}$ is input into the coupled port 103A of the wideband directional coupler 104_1 with the purpose of driving/manipulating the qubit 154_1 to the desired state. The wideband directional coupler 104_1 couples a portion of the microwave drive signal (for example 1%) at the frequency $f_{q1}$ to port 103B of the wideband directional coupler 104_1 and dissipates the remainder (or nearly all of the remainder) of the microwave drive signal at $f_{q1}$ at the isolated port 103D (connected to a 50Ω cold termination). The drive microwave signal at the frequency $f_{q1}$ is input to the qubit-resonator system 102_1 and causes the qubit 154_1 to resonate because the drive microwave signal at the frequency $f_{q1}$ matches or nearly matches the qubit resonance frequency $f_{q1}$ of the qubit 154_1. The reflected microwave signal at frequency $f_{q1}$ off the qubit-resonator system 102_1 enters the input port 103B of the wideband directional coupler 104_1 and most of the signal (for example 99%) leaves through port 103C. The wideband directional coupler 104_1 is configured to output the reflected (drive) microwave signal at frequency $f_{q1}$ to the common port 105A of the diplexer 106_1. The diplexer 106_1 (along with diplexers 106_2 through 106_N) has a low-pass filter connected to port 105B and a high-pass filter connected to port 105C. The low-pass filter is designed to pass the reflected drive microwave signal at frequency $f_{q1}$ to port 105B, such that the reflected drive microwave signal at frequency $f_{q1}$ is dissipated by the 50Ω cold termination. Typically, the different qubit resonance frequencies $f_{q1}$ through $f_{qN}$ for the respective qubits 154_1 through 154_N are in the frequency range of about 3.5-5.5 gigahertz (GHz). Accordingly, the drive microwave signals and the corresponding reflected drive microwave signals (for qubits 154_1 through 154_N) are in the frequency range of about 3.5-5.5 gigahertz (GHz). The low-pass filter in each of the diplexers 106_1 through 106_N is designed to pass the reflected drive microwave signals at qubit resonance frequencies $f_{q1}$ through $f_{qN}$ for the respective qubits 154_1 through 154_N, such that none of the qubit resonance frequencies $f_{q1}$ through $f_{qN}$ for the respective qubits 154_1 through 154_N reach the signal combiner 108. In some implementations, the low-pass filters can be designed to pass frequencies below 5.6 GHz in order to pass the qubit frequencies in the frequency range of about 3.5-5.5 gigahertz. In other implementations, when the qubit resonance frequencies $f_{q1}$ through $f_{qN}$ are less than 5.0 GHz, the low-pass filters can be designed to pass frequencies below 5 GHz to the port 105B to the 50Ω cold termination.

If the reflected drive microwave signals at qubit resonance frequencies $f_{q1}$ through $f_{qN}$ were not dissipated by the diplexers 106_1 through 106_N, the signal combiner 108 would reject the qubit resonance frequencies $f_{q1}$ through $f_{qN}$, and therefore, these rejected signals would be reflected back to the qubit-resonator system 102_1 through 102_N. This is an unwanted situation and is avoided by having the low-pass filter at port 105B and by having the high pass filter at port 105C that rejects qubit resonance frequencies $f_{q1}$ through $f_{qN}$.

The diplexers 106_1 through 106_N are 3-port devices with ports 105A, 105B, and 105C. Only the diplexer 106_1 is labeled with ports 105A-105C so as not to obscure the figures. However, it should be appreciated that the other diplexers 106_2 through 106_N analogously have the same ports and operate the same as the diplexer 106_1 having its ports labeled.

Returning to the example scenario of driving the qubit 154_1 in qubit-resonator system 102_1, the reflected drive microwave signal at frequency $f_{q1}$ has been dissipated and driving the qubit 154_1 in qubit-resonator system 102_1 is complete. This same driving process discussed for qubit 154_1 in qubit-resonator system 102_1 applies to driving the qubits 154_2 through 154_N in qubit-resonator system 102_2 through 102_N but with respective qubit resonance frequencies $f_{q2}$ through $f_{qN}$ and the respective input line.

As an example of readout of a qubit-resonator in FIG. 1, the following scenario explains reading out the qubit-resonator system 102_1 having the readout resonator 152_1 and superconducting qubit 154_1 but applies by analogy to reading out the qubit-resonator systems 102_2 through 102_N having readout resonators 152_2 through 152_N and superconducting qubits 154_2 through 154_N, respectively. The state of each of the qubits 154_1 through 154_N can be read out simultaneously or nearly simultaneously by reading out the respective readout resonators 152_1 through 152_N. Each of the readout resonators 152_1 through 152_N has its own resonance frequency, which can be referred to as a readout resonator frequency or readout resonator resonance frequency. For example, the readout resonators 152_1 through 152_N have (different) readout resonator resonance frequencies $f_1$ through $f_N$ respectively, where N is the last number. In the example scenario of reading out the readout resonator 152_1 in qubit-resonator system 102_1, the readout resonator 152_1 has the readout resonator resonance frequency $f_1$. Accordingly, a (readout) microwave signal (tone) at the frequency $f_1$ is input into the coupled port 103A of the wideband directional coupler 104_1 with the purpose of reading out the readout resonator 152_1. The wideband directional coupler 104_1 couples a portion of the microwave readout signal at $f_1$ to port 103B of the wideband directional coupler 104_1 and dissipates the remainder (or nearly all the remainder) of the readout signal at frequency $f_1$ at the isolated port 103D (connected to a 50Ω cold termination). The readout microwave signal at the frequency $f_1$ is input to the qubit-resonator system 102_1. At this point, the process for inputting the drive microwave signal and readout microwave signal is the same. However, being input to the qubit-resonator system 102_1, the readout microwave signal at the frequency $f_1$ causes the readout resonator 152_1 to resonate because the readout microwave signal at the frequency $f_1$ is matches or nearly matches the readout resonator resonance frequency $f_1$ of the readout resonator 152_1. By having the readout microwave signal at frequency $f_1$ on resonance with the readout resonator 152_1, this causes the readout resonator 152_1 to transmit a reflected (readout resonator) microwave signal at frequency $f_1$. The reflected readout microwave signal at frequency $f_1$ is output from the qubit-resonator system 102_1 back to the input port 103B of the wideband directional coupler 104_1. The wideband directional coupler 104_1 is configured to output most of the reflected readout microwave signal at frequency $f_1$ to the output port of 103C of the directional coupler 104_1 and afterwards to the common port 105A of the diplexer 106_1. The diplexer 106_1 (along with diplexers 106_2 through 106_N) has the low-pass filter at port 105B and the high-pass filter at port 105C. The high-pass filter is designed to pass the reflected readout resonator microwave signal at frequency $f_1$ through port 105C to port 107_1 of the signal combiner 108, while blocking reflected qubit microwave signal at frequency $f_1$. Typically, the different readout resonance frequencies $f_1$ through $f_N$ for the respective readout resonator 152_1 through 152_N are in the frequency range of about 6 GHz or higher. The readout resonators 152_1 through 152_N are designed to have different resonance frequencies. The high-pass filter in each of the diplexers 106_1 through 106_N is designed to pass the respective reflected readout microwave signals at the readout resonance frequencies $f_1$ through $f_N$ for the respective readout resonators 152_1 through 152_N, such that each of the readout resonance frequencies $f_1$ through $f_N$ for the readout resonators 152_1 through 152_N reach the signal combiner 108. For example, the high-pass filters can be designed to pass frequencies above 6 GHz.

Example details of the diplexers 106_1 through 106_N have been illustrated for explanation purposes, but implementation of the diplexers 106_1 through 106_N is not meant to be limited. For example, the diplexers 106_1 through 106_N do not necessarily have to use a low-pass filter and high-pass filter. In other implementations, the diplexers 106_1 through 106_N can use band-pass filters in which one bandpass filter that transmits in the range of the qubit frequencies ($f_{q1}$ through $f_{qN}$) is connected to port 105B and another bandpass filter that transmits in the range of the readout frequencies ($f_1$ through $f_N$) is connected to 105C.

Returning to the example scenario of reading out the readout resonator 152_1 in qubit-resonator system 102_1, the reflected readout microwave signal at frequency $f_1$ has been input to port 107_1 of the signal combiner 108. The signal combiner 108 is configured to combine the microwave signal at frequency $f_1$ from readout resonator 152_1 with the readout microwave signals at frequency $f_2$ through $f_N$ from readout resonators 152_2 through 152_N (which have been similarly input via ports 107_2 through 107_N). The combined reflected microwave signals at frequencies $f_1$ through $f_N$ are then output from the port 109 of the signal combiner 108 to the wideband quantum-limited directional amplifier 110. The amplifier 110 is configured to amplify the combined reflected microwave signal of frequencies $f_1$ through $f_N$. The amplifier 110 is designed to amplify within a bandwidth that covers readout frequencies $f_1$ through $f_N$. The amplified microwave signals of frequencies $f_1$ through $f_N$ is output to a wideband circulator 112 that passes the combined reflected microwave signals of frequencies $f_1$ through $f_N$ to a transmission line designated as OUT.

This same readout process discussed for readout resonator 152_1 in qubit-resonator system 102_1 applies to reading out the readout resonators 152_2 through 152_N in qubit-resonator system 102_2 through 102_N but with respective readout resonator resonance frequencies $f_2$ through $f_N$.

According to embodiments, the integrated drive and readout circuit 100 provides many benefits. The circuit 100 can be fully integrated on a chip or printed circuit board. The circuit 100 minimizes the number of output lines (OUT) and control lines. A control line would only be needed for the quantum-limited amplifier 110 if the quantum-limited amplifier 110 is on the chip 100, and FIG. 3 illustrates an example where the quantum-limited amplifier 110 is not on the chip 100. All components (e.g., are passive and do not require any control lines that carry drives or control signals with the exception of the directional amplifier (i.e., quantum-limited amplifier 100) and the on-chip circulator/isolator (e.g., circulator 112). The drive and readout technique with circuit 100 does not require the use of off-chip circulators or isolators. This integrated circuit 100 can be thermalized well because the circuit 100 does not require the large number of circulators/isolators as would be needed in the state-of-the-art. For example, for each one of the N qubit-resonator systems 102, the state-of-the-art high-fidelity measurement scheme requires two circulators (assuming the use of a Josephson parametric amplifier in the output chain) and three isolators per qubit-resonator system. Accordingly, the technique using the circuit 100 can have lighter weight and smaller footprint in embodiments than state-of-the-art approaches which incorporate commercial cryogenic circulators and isolators. Further, the circuit 100 can have a low insertion loss, for example, less than (<) 2 decibels (dB) as it can be implemented using superconducting circuits or very low-loss normal metal, and low-loss dielectric components. The low-loss requirement is needed in order to minimize the loss of quantum information in the output chain.

FIG. 3 is a schematic of an integrated drive and readout circuit assembly 100 according to embodiments. In FIG. 3, fewer circuit elements are depicted on the integrated circuit 100 than in FIGS. 1 and 2. FIG. 3 illustrates the integrated circuit 100 having the wideband directional couplers 104_1 through 104_N, the diplexers 106_1 through 106_N, and the signal combiner 108. FIG. 3 does not have the quantum-limited directional amplifier 110 and the circulator 112 on chip. FIG. 3 illustrates an example with a quantum processor 300 operatively connected to the integrated circuit 100. The drive and readout operation in FIG. 3 is identical to that explained in FIGS. 1 and 2.

Figure 4:
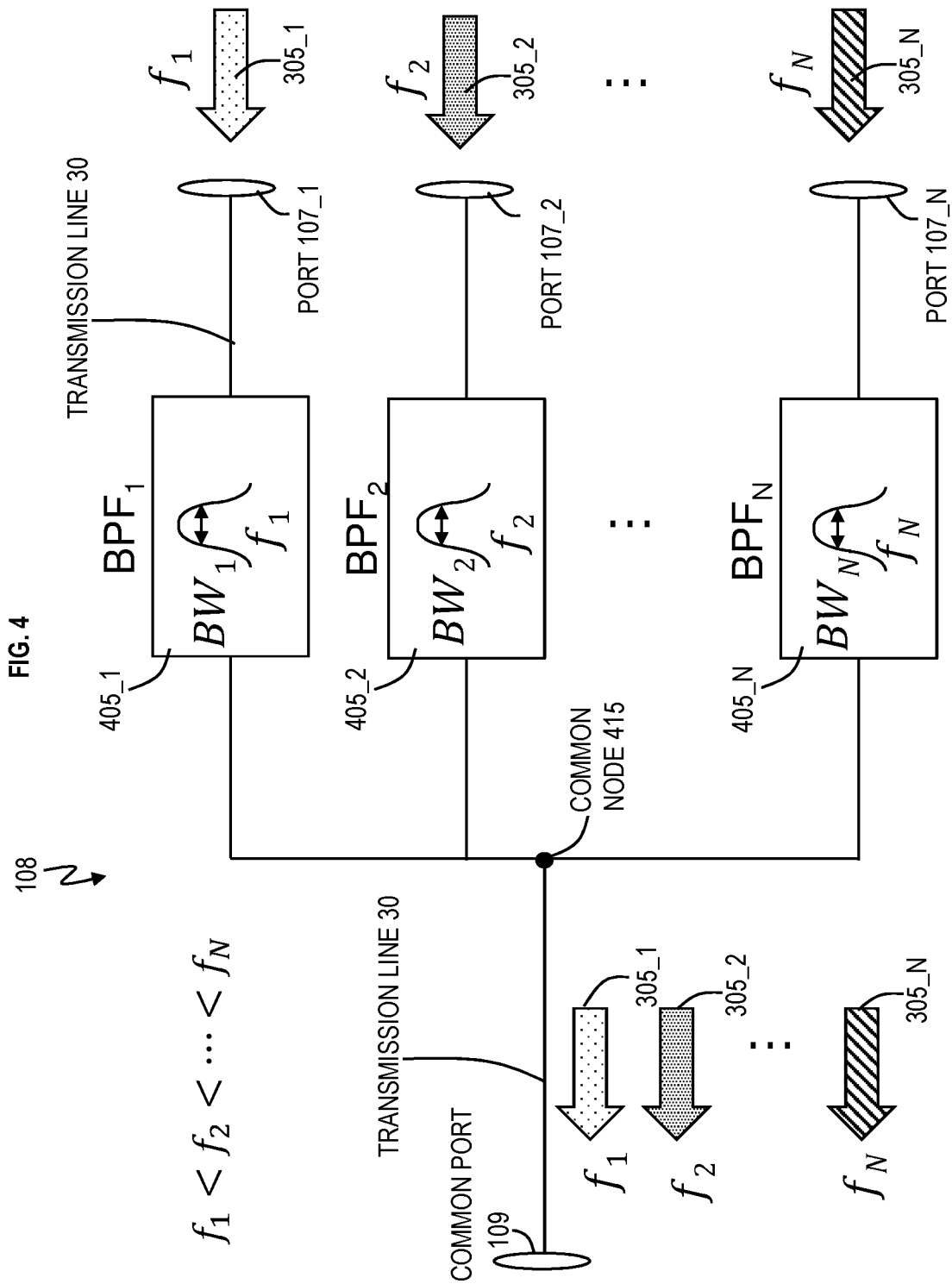
FIG. 4 is a schematic of a signal combiner according to embodiments of the present invention.

FIG. 4 is a schematic of the signal combiner 108 for combining quantum signals (i.e., microwave signals) according to embodiments. The signal combiner 108 is configured to utilize frequency division multiplexing to allocate different frequencies for different microwave signals onto a single output transmission line. The signal combiner 108 includes bandpass microwave filters generally referred to as bandpass filters 405. The different bandpass filters 405 are depicted as bandpass filters 405_1 through bandpass filters 405_N. Each bandpass filter 405 has a different narrow passband through which microwave signals having a frequency in the particular narrow passband are transmitted (i.e., passed) and signals having a frequency outside of the particular narrow passband are reflected (i.e., blocked). The bandpass filter 405_1 has its own narrow passband with a bandwidth 1 ($BW_1$), bandpass filter 405_2 has its own narrow passband with a bandwidth 2 ($BW_2$), and bandpass filter 405_N has its own narrow passband with a bandwidth N ($BW_N$).

For example, bandpass filter 405_1 is configured with a passband (frequency band) that permits a (reflected readout) microwave signal 305_1 having frequency $f_1$ (corresponding to the readout resonator 152_1) to pass (transmit) through but blocks (reflects) all other microwave signals 305_2 through 305_N having frequencies $f_2$ through $f_N$ which are outside of the passband for bandpass filter 405_1. Similarly, bandpass filter 405_2 is configured with a passband (frequency band) that permits a (reflected readout) microwave signal 305_2 having frequency $f_2$ (corresponding to the readout resonator 152_2) to pass (transmit) through but blocks (reflects) all other microwave signals 305_1, 305_3 through 305_N having frequencies $f_1$, $f_3$ through $f_N$ which are outside of the passband for bandpass filter 405_2. Analogously, bandpass filter 405_N is configured with a passband (frequency band) that permits a (reflected readout) microwave signal 305_N having frequency $f_N$ (corresponding to readout resonator 152_N) to pass (transmit) through but blocks (reflects) all other microwave signals 305_1 through 305_N−1 having frequencies $f_1$ through $f_{N-1}$ which are outside of the passband for bandpass filter 405_N. The microwave signals 305_1 through 305_N are generally referred to as microwave signals 305. When qubit-resonator quantum systems 102_1 through 102_N are operatively connected to the signal combiner 108, the microwave signals 305 can be at respective frequencies $f_1$ through $f_N$ designated to readout qubit (via readout resonators or cavities), as understood by one skilled in the art.

The signal combiner 108 includes ports 107_1 through 107_N individually connected to respective bandpass filters 405_1 through 405_N. In the signal combiner 108, port 107_1 is connected to bandpass filter 405_1, port 107_2 is connected to bandpass filter 405_2, and port 107_N is connected to bandpass filter 405_N. Each port 107_1 through 107_N is connected to one end of its own bandpass filter 405_1 through bandpass filter 405_N. The other end of the bandpass filter 405_1 through 405_N is connected to a common port 109 via a common node 415. The common node 415 can be a common connection point, a common transmission line, a common wire, etc., as a mutual location for electrical connection. The common port 109 connects to each bandpass filter 405_1 through bandpass filter 405_N, while the individual ports 107_1 through 107_N are connected (only) to their respective bandpass filter 405_1 through bandpass filter 405_N.

Because the bandpass filters 405_1 through 405_N only transmit respective reflected readout microwave signals 305_1 through 305_N in the respective passband, the signal combiner 108 is configured such that each bandpass filter 405_1 through bandpass filter 405_N covers a different band (or sub-band) of frequencies, such that none of the passbands (of the bandpass filters 405) are overlapping. Accordingly, each port 107_1 through port 107_N is isolated from one another because of being connected to its respective bandpass filter 405_1 through 405_N, such that no microwave signal 305 through any one port 107 leaks into another port 107 via the common node 415. As such each port 107 is isolated from other ports 107 and is designed to transmit its own microwave signal 305 at a predefined frequency (or within a predefined frequency band), as a result of being connected to its own bandpass filter 405. Accordingly, the bandpass filters 405_1 through 405_N are responsible for providing the isolation among ports 107-1 through 107_N.

The respective ports 107, bandpass filters 405, common node 415, and common port 109 are connected to one another via transmission lines 30. The transmission line 30 can be a stripline, microstrip, coplanar waveguide, etc. The microwave bandpass filters 405 are designed and implemented using lossless or low loss lumped elements such as superconducting inductors, superconducting gap capacitors and/or plate capacitors, passive superconducting elements. The superconducting elements include lumped-element inductors, meander lines, kinetic inductance lines, gap capacitors, interdigitated capacitors, and/or plate capacitors (with low loss dielectrics). Other possible implementations of the bandpass filters include coupled-line filters, and/or capacitively-coupled series resonators.

The signal combiner 108 is configured with the frequency relation $f_1 < f_2 < \ldots < f_N$, where each frequency $f_1, f_2, \ldots f_N$ is the center frequency of the bandpass filters 405_1 through 405_N, respectively. The signal combiner 108 is configured such that it satisfies the inequality $$\frac{BW_j + BW_i}{2} < |f_j - f_i|$$

where i, j=1, 2, . . . N and j≠i. This inequality requires that the frequency spacing between the center frequencies of each pair of bandpass filters exceeds their average bandwidths. In other words, the inequality ensures that none of the bandpass filters have overlapping bandwidths (i.e., frequency range). As an example, one bandpass filter 405 can have a passband of 1 megahertz (MHz), another bandpass filter 405 can have a passband of 10 MHz, yet another bandpass filter 405 can have a passband of 100 MHz, and so forth.

Figure 5:
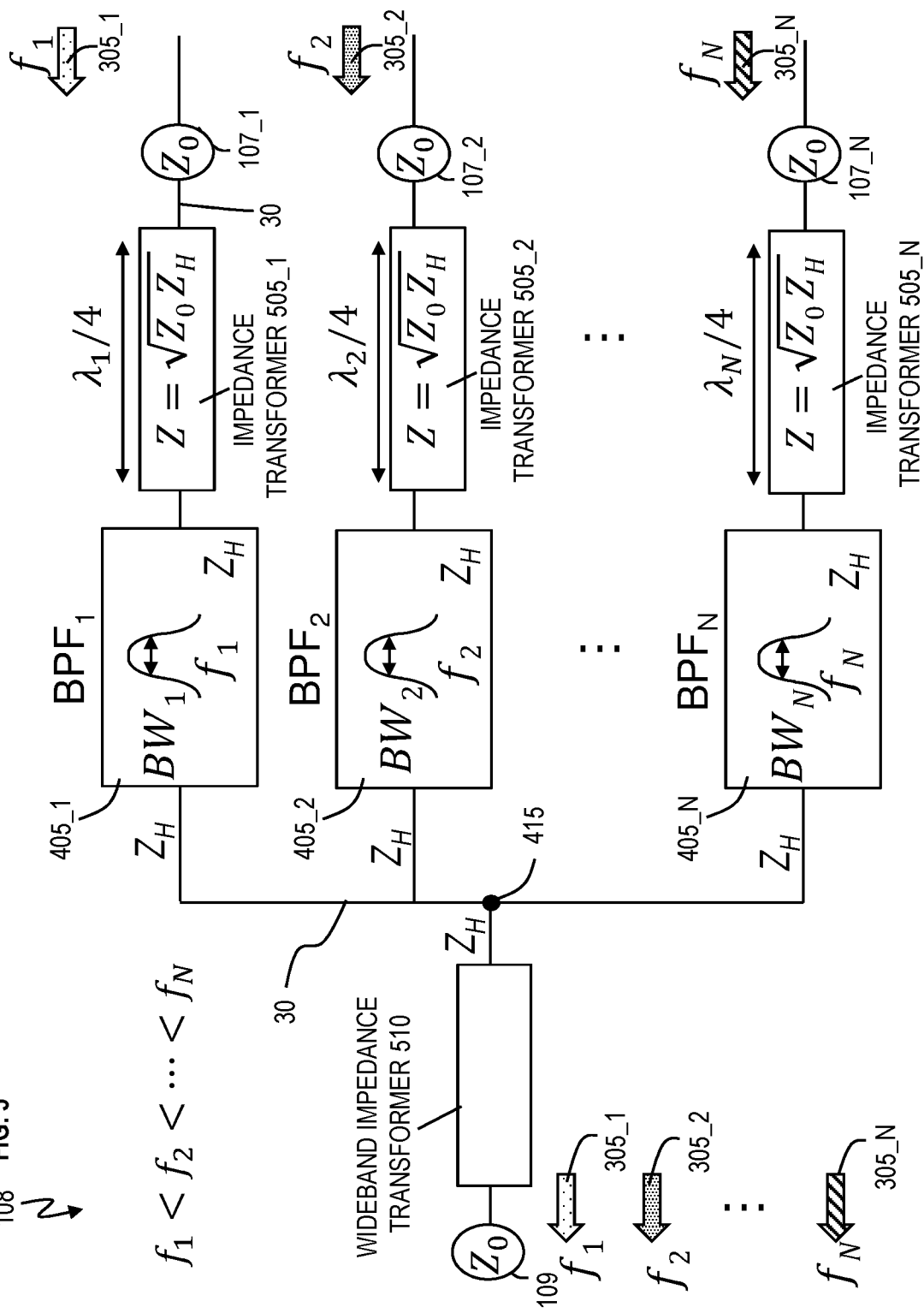
FIG. 5 is a schematic of a signal combiner according to embodiments of the present invention.

FIG. 5 is a schematic of the signal combiner 108 for quantum signals according to embodiments. The signal combiner 108 includes all the various features discussed herein. Further, the signal combiner 108 includes additional features to ensure impedance matching for passing microwave signals (i.e., minimize reflections along the signal path), and also to enable the connection of multiple branches/lines to the common node 415.

In FIG. 5, impedance transformers 505_1 through 505_N are respectively added between the respective ports 107_1 through 107_N and their associated bandpass filters 405_1 through 405_N. Also, the signal combiner 108 includes a wideband impedance transformer 510 connected to the common node 415 and the common port 109. The impedance transformers 505_1 through 505_N and impedance transformer 510 are configured to provide impedance matching. On one end of the signal combiner 108, the impedance transformers 505_1 through 505_N are structured to match (or nearly match) the input impedance $Z_0$ of the ports 107_1-107_N and to match the characteristic impedance associated with bandpass filter 405_1 through 405_N. Each of the impedance transformers 505_1 through 505_N is configured with a characteristic impedance $Z=\sqrt{Z_0 Z_H}$, where $Z_0$ is the input impedance (as well as the output impedance), where $Z_H$ is the high impedance of the bandpass filters 405_1 through 405_N, and where Z is the impedance of each impedance transformers 505_1 through 505_N. The average characteristic impedance Z is the square root of the product of $Z_0$ and $Z_H$. Each of the impedance matching transformers 505_1 through 505_N has a length according to its own respective relationship $\lambda_1/4, \lambda_2/4, \ldots, \lambda_N/4$, where $\lambda_1$ is the wavelength of the microwave signal 305_1, where $\lambda_2$ is wavelength of the microwave signal 305_2, through $\lambda_N$ which is the wavelength of the microwave signal 305_N. These impedance transformers have in general narrow bandwidths. One reason why transforming the impedance of the device ports $Z_0$ to high characteristic impedance $Z_H$ in the region of the common node can be useful is because, in general, high impedance transmission lines, such as a microstip or stripline, have narrow traces which in turn minimize the physical size of the common node and allows more lines to be joined together at that node. This is particularly relevant if the bandpass filters are implemented as coupled-line filters and/or capacitively-coupled resonators. If, however, all bandpass filters are implemented using lumped-elements (with a very small footprint), such impedance transformations might be needed less.

In one implementation, the impedance transformers 505_1 through 505_N can be impedance matching transmission lines, i.e., tapered, where one end has a wide width matching the input impedance $Z_0$ and the opposite end has a narrow width matching the high impedance $Z_H$ of the bandpass filters 405.

In one implementation, the wideband impedance transformer 510 can be an impedance matching transmission line where one end has a narrow width matching the high impedance $Z_H$ of the bandpass filters 405 (via common node 415) while the opposite end has a wide width matching the output impedance $Z_0$. Such a wideband impedance transformer 510 can be implemented using tapered transmission lines, for example, transmission lines whose widths are changed adiabatically on the scale of the maximum signal wavelength. Other implementations of tapered lines known to one skilled in the art are possible as well, such as the Exponential Taper or the Klopfenstein Taper. Also, it should be noted that the wideband requirement for this impedance transformer versus the other transformers 505 arises from the fact that this wideband transformer 510 needs to match the characteristic impedance for a wideband of signal frequencies transmitted through it, in contrast to the impedance transformers 505 which need only to match the impedance for a narrow frequency range centered around the corresponding center frequency of the respective bandpass.

FIG. 5 illustrates one particular example for impedance matching, and it should be appreciated that the general scheme of the combiner 108 is not limited to this particular implementation. For example, in some implementations, the bandpass filters 405 can have the same characteristic impedance as the port $Z_0$ (107), and impedance transformers are incorporated between the bandpass filters 405 and the high impedance $Z_H$ connecting to the common node 109.

The impedance designation $Z_0$ is the characteristic impedance at ports 107_1 through 107_N and port 109 (which can be the input and output ports). For example, the characteristic impedance $Z_0$ can be 50 ohms (Ω) at each ports 107 and 109 as recognized by one skilled in the art.

It should be noted that N represents the last of each of the frequencies, microwave signals 305, bandpass filters 405, and the impedance transformers 505_N. Also, N represents the last of qubit-resonator systems 102, readout resonators 152, qubits 154, directional couplers 104, diplexers 106, and so forth.

The circuit elements of the circuit 100 can be made of superconducting material. The respective ports 107, bandpass filters 405, common node 415, common port 109, impedance transformers 505, and transmission lines 30 are made of superconducting materials. Additionally, the qubit-resonator systems 102, readout resonators 152, qubits 154, directional couplers 104, diplexers 106, amplifier 110, and circulator 112 are made of superconducting materials. Examples of superconducting materials (at low temperatures, such as about 10-100 millikelvin (mK), or about 4 K) include niobium, aluminum, tantalum, etc. For example, the Josephson junctions are made of superconducting material, and their tunnel junctions can be made of a thin tunnel barrier, such as an oxide. The capacitors can be made of superconducting material separated by low-loss dielectric material. The transmission lines (i.e., wires) connecting the various elements are made of a superconducting material.

FIG. 6 is a flow chart 600 of a method of forming an integrated drive and readout circuit/assembly 100 according to embodiments. The method includes providing directional couplers 104_1 through 104_N configured to connect to qubit-resonator systems 102_1 through 102_N respectively at block 602, connecting diplexers 106_1 to the directional couplers 104_1 through 104_N respectively at block 604, and connecting a microwave signal combiner 108 to each of the diplexers 106_1 through 106_N at block 606.

Each of the directional couplers 104_1 through 104_N includes a first port, a second port, a third port, and a fourth port. The first port 103A is configured to receive a qubit signal and a readout signal, the second port 103B is connectable to the qubit-resonator systems 102_1 through 102_N, the third port 103C is connectable to the diplexers 106_1 through 106_N, and the fourth port 103D is an isolated port.

The diplexers 106_1 through 106_N each include a low-pass filter port 105B, a high-pass filter port 105C, and a common port (C) 105A. The common port is configured to support both low and high frequency bands associated with the low-pass-band port and high-pass-band port respectively. The common port 105A of the diplexers 106_1 through 106_N is connected to the directional couplers 104_1 through 104_N respectively.

The diplexers 106_1 through 106_N are configured to direct a reflected drive microwave signal to the low-pass filter port 105B, where the low-pass filter port 105B is connected to a termination point (e.g., 50Ω termination). The high-pass filter port 105C is connected to the signal combiner 108. The microwave signal combiner 108 is configured to combine microwave signals from each the diplexers 106_1 through 106_N as depicted in FIG. 1. The microwave signal combiner 108 is configured to output combined microwave signals (e.g., combined microwave signals having frequencies $f_1$ through $f_N$) to a quantum-limited amplifier 110. The quantum-limited amplifier 110 is configured to amplify the combined microwave signals and output the combined microwave signals to a circulator 112.

FIG. 7 is flow chart 700 of a method of driving qubit-resonator systems 102_1 through 102_N according to embodiments. The method includes transmitting, by directional couplers 104_1 through 104_N, (drive) microwave signals (at the qubit resonance frequencies $f_{q1}$ through $f_{qN}$) to the qubit-resonator systems 102_1 through 102_N respectively (at block 702), receiving, by the directional couplers 104_1 through 104_N, reflected (drive) microwave signals (at the qubit resonance frequencies $f_{q1}$ through $f_{qN}$) from the qubit-resonator systems 102_1 through 102_N (at block 704), and receiving, by the diplexers 106_1 through 106_N, the transmitted (drive) microwave signals from the directional couplers 104_1 through 104_N respectively (at block 706). In other words, the reflected signals off the qubit-resonator systems 102_1 through 102_N get transmitted through the directional coupler 104_1 through 104_N. The diplexers 106_1 through 106_N are configured to direct the reflected (drive) microwave signals (at the qubit resonance frequencies $f_{q1}$ through $f_{qN}$) to a terminated port (e.g., 50Ω cold termination).

FIG. 8 is a flow chart 800 of a method of reading out qubit-resonator systems (i.e., inferring the state of superconducting qubits 154_1 through 154_N by reading out the readout resonators 152_1 through 152_N respectively) according to embodiments. The method includes transmitting, by directional couplers 104_1 through 104_N, (readout) microwave signals (at the readout resonance frequencies $f_1$ through $f_N$) to the qubit-resonator systems 102_1 through 102_N respectively (at block 802), and receiving, by the directional couplers 104_1 through 104_N, reflected (readout) microwave signals (at the readout resonance frequencies $f_1$ through $f_N$) from the qubit-resonator systems 102_1 through 102_N respectively (at block 804). Also, the method includes receiving, by the diplexers 106_1 through 106_N, the transmitted readout microwave signals (at the readout resonance frequencies $f_1$ through $f_N$) through the directional couplers 104_1 through 104_N respectively (at block 806), and receiving, by the microwave signal combiner 108, the transmitted readout microwave signals (at the readout resonance frequencies $f_1$ through $f_N$) from the diplexers 106_1 through 106_N respectively (at block 808). It is noted that the transmitted readout microwave signals (at the readout resonance frequencies $f_1$ through $f_N$) were previously reflected (readout) microwave signals (at the readout resonance frequencies $f_1$ through $f_N$) from the qubit-resonator systems 102_1 through 102_N.

The microwave signal combiner 108 is configured to combine the multiple transmitted readout microwave signals into multiple microwave signals (at the readout frequencies $f_1$ through $f_N$). Further, the method include transmitting, by the microwave signal combiner 108, the combined readout microwave signals (including the readout resonance frequencies $f_1$ through $f_N$) to a quantum-limited amplifier 110 (at block 810).

Technical effects and benefits include methods and structures for a scalable qubit drive and readout circuit. These structures that can be fully integrated on a chip or a printed circuit board. Technical advantages include minimizing the number of output and control lines. Additionally, technical effects and benefits include a structure that has lighter weight, can be thermalized better, and has smaller footprint than schemes which incorporate commercial cryogenic circulators and isolators The term "about" and variations thereof are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate the architecture, functionality, and operation of possible implementations of systems, methods, and computer program products according to various embodiments of the present invention. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments discussed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments discussed herein.

What is claimed is:

1. A method of driving at least one qubit-resonator system, the method comprising:
   transmitting, via a circuit, a drive signal to the at least one qubit-resonator system;
   receiving, via the circuit, the drive signal having been reflected from the at least one qubit-resonator system; and
   directing, via the circuit, the drive signal having been reflected to a termination.

2. The method of claim 1, wherein the circuit is configured to terminate any other drive signal having been reflected from any other qubit-resonator system.

3. The method of claim 1, wherein the circuit is configured to terminate signals above a predefined frequency which have been reflected from the at least one qubit-resonator system.

4. The method of claim 1, wherein the circuit is configured to pass signals above a predefined frequency, such that the signals are passed to a combiner in the circuit.

5. The method of claim 1, wherein the circuit includes a directional coupler.

6. The method of claim 5, wherein the directional coupler transmits the drive signal to the at least one qubit-resonator system.

7. The method of claim 1, wherein the circuit includes a diplexer.

8. The method of claim 7, wherein the diplexer receives the drive signal having been reflected from the at least one qubit-resonator system.

9. The method of claim 8, wherein the diplexer terminates the drive signal having been reflected from the at least one qubit-resonator system, thereby preventing transmission of the drive signal to a signal combiner.

10. The method of claim 8, wherein the diplexer passes any signal above a predefined frequency to a signal combiner.

11. A method of reading out at least one qubit-resonator system, the method comprising:
    transmitting, via a circuit, a readout signal to the at least one qubit-resonator system;
    receiving, via the circuit, the readout signal having been reflected from the at least one qubit-resonator system; and
    directing the readout signal having been reflected to be with at least one other reflected readout signal.

12. The method of claim 11, wherein the readout signal is combined with the at least one other reflected readout signal.

13. The method of claim 11, wherein the readout signal is combined with the at least one other reflected readout signal using a signal combiner of the circuit.

14. The method of claim 11, wherein the readout signal is combined with the at least one other reflected readout signal into combined signals.

15. The method of claim 14, further comprising transmitting the combined signals to an amplifier.

16. The method of claim 15, wherein the amplifier receives the combined signals from a signal combiner.

17. The method of claim 15, wherein the amplifier is a quantum-limited amplifier.

18. The method of claim 11, wherein any signal above a predefined frequency is not directed to be with the at least one other reflected readout signal.

19. The method of claim 11, wherein a diplexer receives the readout signal having been reflected from the at least one qubit-resonator system.

20. The method of claim 19, wherein the diplexer directs the readout signal having been reflected to be with the at least one other reflected readout signal at a signal combiner.

* * * * *